(12) United States Patent
Tamaki et al.

(10) Patent No.: US 7,830,079 B2
(45) Date of Patent: Nov. 9, 2010

(54) LIGHT EMITTING DEVICE HAVING A PACKAGE FORMED WITH FIBROUS FILLERS

(76) Inventors: Hiroto Tamaki, 491-100, Oka, Kaminaka-cho, Anan-shi (JP); Morito Kanada, 491-100, Oka, Kaminaka-cho, Anan-Shi (JP)

( * ) Notice: Subject to any disclaimer, the term of this patent is extended or adjusted under 35 U.S.C. 154(b) by 401 days.

(21) Appl. No.: 11/800,144

(22) Filed: May 4, 2007

(65) Prior Publication Data
US 2007/0262336 A1    Nov. 15, 2007

(30) Foreign Application Priority Data
May 11, 2006   (JP)   ............................ 2006-132748

(51) Int. Cl.
  *H01L 33/00*   (2010.01)
(52) U.S. Cl. ........................................ 313/498; 257/98
(58) Field of Classification Search ................. 313/498, 313/512; 257/98, 100
See application file for complete search history.

(56) References Cited

U.S. PATENT DOCUMENTS

| | | | | |
|---|---|---|---|---|
| 4,935,665 A | * | 6/1990 | Murata | 313/500 |
| 6,670,648 B2 | * | 12/2003 | Isokawa et al. | 257/99 |
| 6,680,568 B2 | * | 1/2004 | Fujiwara et al. | 313/501 |
| 6,873,098 B2 | * | 3/2005 | Christensen, Sr. | 313/498 |
| 2005/0156184 A1 | * | 7/2005 | Shen | 257/98 |
| 2006/0038477 A1 | * | 2/2006 | Tamaki et al. | 313/485 |

FOREIGN PATENT DOCUMENTS

| | | | |
|---|---|---|---|
| JP | 06264250 A | * | 9/1994 |
| JP | 2003-282955 | | 9/2002 |
| JP | 2006-005091 | | 5/2006 |

\* cited by examiner

*Primary Examiner*—Nimeshkumar D Patel
*Assistant Examiner*—Peter R Haderlein
(74) *Attorney, Agent, or Firm*—Perkins Coie LLP

(57) ABSTRACT

A light emitting device includes a package having a recessed portion defined by a bottom surface and a side surface and a light emitting element mounted on the bottom surface of the recessed portion, in which the package has fibrous fillers, and at least some of the fillers are projected outwards through the side surface and coated with a reflection film made of metal.

20 Claims, 10 Drawing Sheets

LIGHT EMITTING DEVICE HAVING A PACKAGE FORMED WITH FIBROUS FILLERS

CROSS REFERENCE TO RELATED APPLICATION

This application claims priority from Japanese Patent Application No. 2006-132748, which is incorporated herein by reference.

FIELD OF THE INVENTION

The present invention relates to a light emitting device that includes a package having a recessed portion defined by a bottom surface and a side surface, and a light emitting element mounted on the bottom surface of the recessed portion.

BACKGROUND OF THE INVENTION

A light emitting diode as an example of the aforesaid light emitting device has a flat-plate like package with a light emitting element mounted thereon, and a cylindrical reflecting case as a reflector mounted on the package. The reflecting case is intended to collect light emitted from the light emitting element and spread sidewards and guide the same forward. Specifically, the reflecting case surrounds the periphery of the light emitting element so as to be able to collect light spread out from the light emitting device and guide forward the same to a given position. In order to be able to emit more light from a light reflecting surface of the reflecting case forward of the light emitting diode, a light reflecting surface (inner side surface) of the reflecting case is coated with metal having a high reflectance ratio, such as Ni, gold, palladium or silver by electrolytic plating coating or electroless plating coating (e.g., cf. Patent Document 1).

Patent Document 1: Japanese Patent Application Laid-open No. 2006-5091 (cf. FIGS. 1 and 2)

However, when the light emitting diode having the above structure is used in severe temperature environmental conditions, a plated metal may be peeled off from the inner side surface of a ceramic frame due to the difference in coefficient of expansion or the like, and thus may become defective.

In consideration of the above circumstances, it is an object of the present invention to provide a light emitting apparatus that has excellent reliability and is capable of emitting high power light.

SUMMARY OF THE INVENTION

According to the present invention, there is provided a light emitting device including a package having a recessed portion defined by a bottom surface and a side surface and a light emitting element mounted on the bottom surface of the recessed portion, wherein
the package has fibrous fillers, and
at least some of the fillers are projected outwards through the side surface and coated with a reflecting film made of metal.

As mentioned above, the package has fibrous fillers and at least some of the fillers are projected outwards through the side surface, so that the projected fillers are stuck in the metal reflecting film. That is, the reflecting film is held with the fillers so that, even if there is a difference in coefficient of thermal expansion between the package and the metal and the light emitting device is used under severe temperature conditions, the reflecting film is securely prevented from being peeled off from the side surface of the recessed portion.

The fillers may be made up of a large number of fillers bundled together. The fibers may be bundled and incorporated into a lattice. A typical example thereof is a package made of a general glass epoxy resin.

It is possible to employ an arrangement in which the light emitting element is sealed with a light transmitting material, and the light transmitting material contacts a portion of the reflecting film.

It is possible to employ an arrangement in which the light emitting element is sealed with a light transmitting material, and the light transmitting material is formed into a dome-like shape.

It is possible to employ an arrangement in which a ground layer is disposed on the side surface of the recessed portion, and the reflecting film is disposed on the ground layer.

The reflecting film may be coated with an anticorrosive agent.

At least a portion of the side surface of the recessed portion may be an uneven surface provided with spiral or annular ridges and grooves.

A pitch between tops of the adjacent ridges of the uneven surface is preferably set in a range of from 1 μm to 200 μm, and a difference in height between tops of the ridges and bottoms of grooves, of the uneven surface is set in a range of from 1 μm to 50 μm.

The difference in height of a portion of the uneven surface that contacts the light transmitting material may be greater than the difference in height of a portion of the uneven surface that does not contact the light transmitting material and is exposed to the outside.

A projected length of the fillers is preferably in a range of from 1 μm to 500 μm.

According to the above arrangement, the package has fibrous fillers and at least some of the fillers are projected outwards through the side surface, so that the projected fillers are stuck in the metal reflecting film. With this arrangement, the reflecting film is prevented from being peeled off from the side surface of the recessed portion having a different coefficient of thermal expansion, even if the light emitting device is used, for example, under severe temperature conditions. Accordingly, it is possible to provide a light emitting device being excellent in reliability and capable of emitting high power light, in which even though a reflecting film can be disposed on the side surface of the recessed portion, it can be prevented from being peeled off therefrom.

When the package made of a general glass epoxy resin is used, it is advantageous in the aspect of manufacturing a light emitting device, and it is also possible to obtain the strength required for the package itself.

When plural fibrous fillers are bundled together, they can be aligned in the same direction and the strength of the fibers is increased. As a result, it is possible to more securely keep the state in which the fibers are stuck in the reflecting film. This arrangement makes the reflecting film harder to be peeled off. Also, the strength of the package can be increased.

When the light emitting element is sealed with the light transmitting material and the light transmitting material contacts a portion of the reflecting film, it is possible to make the light transmitting material hard to be peeled off in comparison with the arrangement having the light transmitting material out of contact to the side surface of the recessed portion.

When the light emitting element is sealed with a light transmitting material and the light transmitting material is formed into a dome-like shape, it is possible to increase the reflecting surface and hence the reflecting efficiency in comparison with an arrangement in which the recessed portion is partly filled with the light transmitting material while the light transmitting material is held in contact with a portion of the inner side surface of the recessed portion.

When a ground layer is disposed on the side surface of the recessed portion and the reflecting film is disposed on the ground layer, it is possible to make the reflecting film hard to be peeled off from the side surface of the recessed portion in comparison with an arrangement in which the reflecting film is directly disposed on the side surface of the recessed portion without providing the ground layer.

When the reflecting film is coated with an anticorrosive agent, it is possible to provide a light emitting device with a high commercial value that can prevent its metal portion from being corroded and hence can be used for a long time in a good condition.

When at least a part of the side surface of the recessed portion is an uneven surface provided with spiral or annular ridges and grooves, it is possible to increase the area contacting the reflecting film by the spiral or annular ridges and grooves, and hence further increase adhesiveness between the side surface of the recessed portion and the reflecting film. Accordingly, it is possible to prevent peeling-off of the metal disposed on the uneven surface by an sticking effect of the projected fillers and an effect of the adhesiveness of the uneven surface.

When the difference in height of a portion of the uneven surface that contacts the light transmitting material is set to be greater than the difference in height of a portion of the uneven surface that does not contact the light transmitting material and is exposed to the outside, it is possible to suppress diffuse reflecting by a portion of the uneven surface, which portion being held out of contact with the light transmitting material and being exposed to the outside, thereby serving as a reflecting surface having a small height difference, while further increase adhesiveness between the side surface of the recessed portion and the reflecting film. In addition, since a side of the uneven surface of the reflecting film, which faces the light emitting element and contacts the light transmitting material, is increased, the contacting area between the reflecting film and the light transmitting material can be increased and hence the light transmitting material is hard to be peeled off from the reflecting film.

BRIEF DESCRIPTION OF THE DRAWINGS

The above, and other objects, features and advantages of the present invention will become apparent from the detailed description thereof in conjunction with the accompanying drawings wherein.

FIG. 1A illustrates the light emitting diode before it is filled with a light transmitting material, and FIG. 1B illustrates the light emitting diode as a finished product with the light transmitting material filled therein.

DETAILED DESCRIPTION OF THE PREFERRED EMBODIMENT

Now, the description will be made for the embodiments of the present invention with reference to the drawings attached hereto.

Figure 1A:
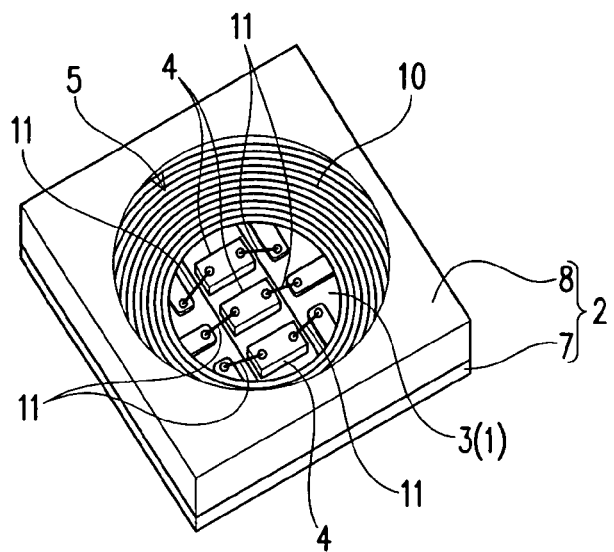
FIGS. 1A and 1B are perspective views of a light emitting diode as viewed from above, and more specifically
Figure 1B:
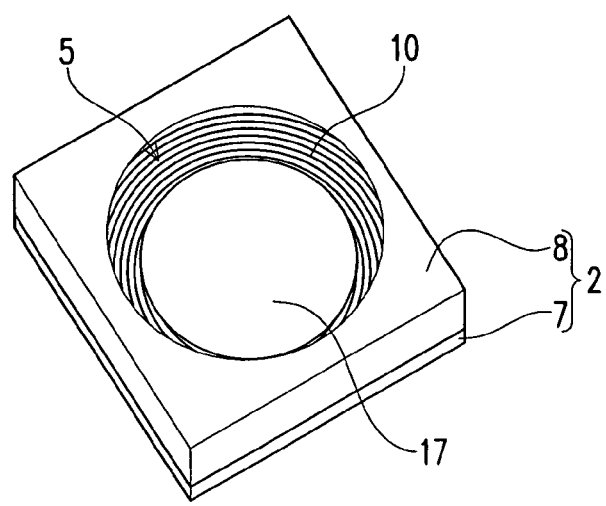

FIGS. 1A and 1B illustrate a light emitting diode as an example of a light emitting device. This light emitting diode includes a package 2 having a recessed portion 1 and three light emitting elements 4 mounted on a bottom surface 3 of the recessed portion 1. FIG. 1A illustrates the light emitting diode in a state just before it is filled with a light transmitting resin material, such as silicone resin or epoxy resin for sealing the three light emitting elements 4, and FIG. 1B illustrates the light emitting diode filled with a light transmitting material 17. Herein, illustration is made for the light emitting diode with three light emitting elements 4 disposed within the recessed portion, but it is possible to dispose one or two, or four or more light emitting elements 4 within the recessed portion. The light emitting elements 4 each have a positive terminal and a negative terminal respectively connected to corresponding positive and negative terminals provided in the recessed portion 1 via bonding wires 11. By the light transmitting material is herein meant not only a clear colorless material but also any material that can transmit light from a light emitting element therethrough.

Figure 2A:
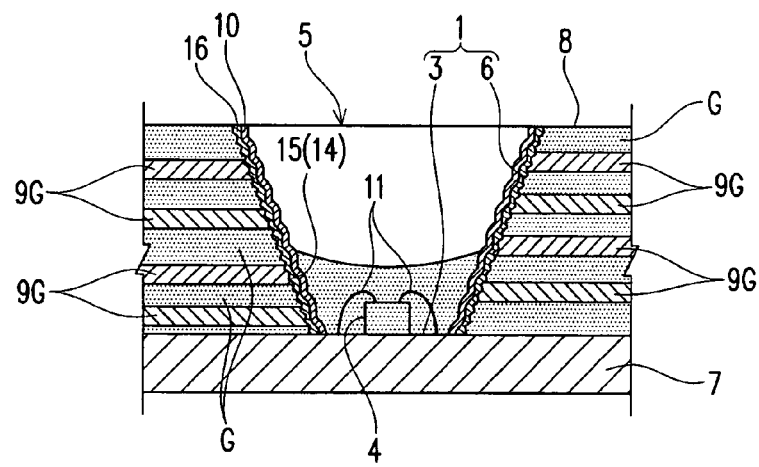
FIG. 2A is a vertically cross sectional view of a light emitting diode.
Figure 2B:
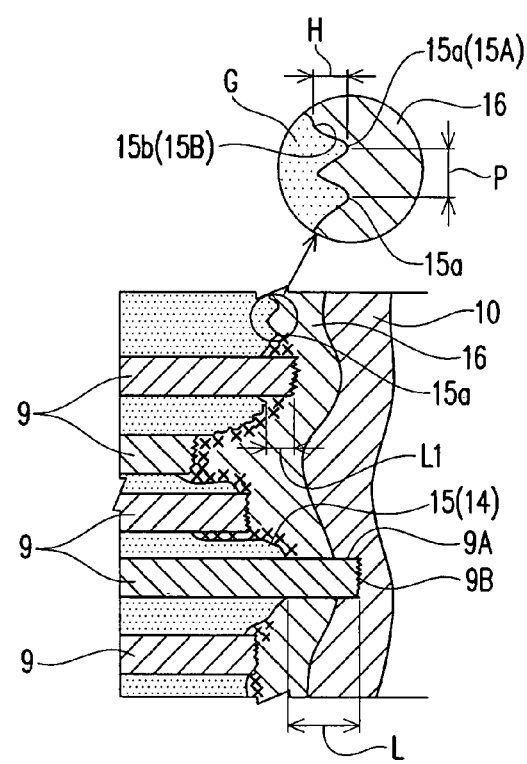
FIG. 2B is an enlarged view of an essential portion of FIG. 2A.
Figure 2C:
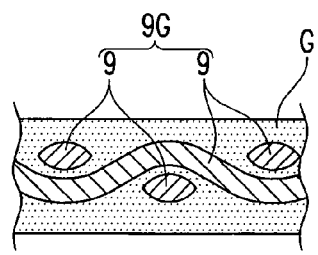
FIG. 2C is a vertically cross sectional view of a package made up of one layer of glass epoxy resin.
Figure 9:
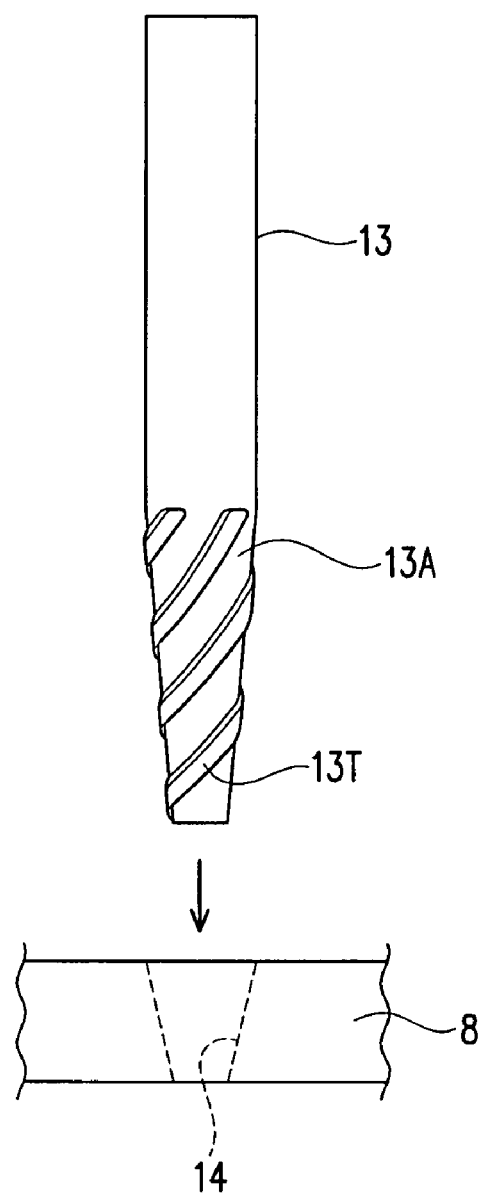
FIG. 9 is a front view of a drill in a state just before it drills a through-hole into a package.

As illustrated in FIGS. 2A, 2B and 2C, the recessed portion 1 is defined by the bottom surface 3 and an inner side surface (side surface) 6 that extends upward from an outer peripheral edge of the bottom surface 3 to an opening 5 and is expanded radially outward as it advances towards the opening 5, thus forming a tapered recess. The bottom surface 3 is formed by using a flat plate member 7 having a square (or rectangular, circular or polygonal) shape as viewed in plan, which plate member 7 being a substrate made of a glass epoxy resin. The inner side surface 6 is formed by using a side wall member 8 of a laminate that comprises a number of glass epoxy resin substrates laminated in the vertical direction, thus forming a parallelepiped body with a vertical thickness having a square (or rectangular, circular or polygonal) shape in plan view, and forming at a center of the parallelepiped body a through-hole 14 by a drill 13 as illustrated in FIG. 9. This side wall member 8 is mounted on the substrate 7 and integrated with the same, thus forming the package 2. Accordingly, the side wall member 8 surrounds the peripheries of the light emitting elements 4 so as to act as a reflector that is capable of converging light from the light emitting elements 4 towards the front side of the opening 5 located above the light emitting elements 4.

The glass epoxy resin substrates of the package 2 each are formed by a plate member that is formed by mixing a large number of fibrous fillers (glass fibers) 9 into an epoxy resin and hardening the same, and these plate members are laminated in the vertical direction according to the required size and integrated together, thereby forming the package 2 having a varying size (more particularly a varying thickness). The plate member 2 that is formed by mixing the fillers (glass fibers) 9 is referred as one layer, and the strength can be increased by laminating two or more layers. The recessed portion 1 is formed by the drill 13 so that some or all of the fillers 9 are projected outwards through the inner side surface of the recessed portion 1 formed in the package 2, and the inner side surface of the recessed portion 1 has a reflecting film 10 made of silver as a metal having a high reflectance ratio. The reflecting film 10 may be formed by a conventional technique such as electroplating, electroless plating, vapor depositing, silver mirror reaction, sputtering, or glossy paint coating. Although a general glass epoxy resin substrate is used in this embodiment, any substrate may be used as long as it has a large number of fibrous fillers mixed in a resin. Also, the package 2 is not necessarily formed by two members 7, 8, and instead, it may be formed by a single member.

As mentioned above, a large number of fibrous fillers 9 are mixed in a resin G, and more specifically in this embodiment, glass fibers are mixed so as to form the package 2 made of a general glass epoxy resin, and as illustrated in FIG. 2B, some or all of the fillers 9 are projected in a horizontal direction (or a direction crossing the inner side surface 6 having the reflecting film 10 thereon). Thus, the projected fillers 9 are stuck in the metal reflecting film 10 deposited by the plating. That is, the reflecting film 10 has the fillers 9 projected thereinto and thus held with the fillers 9 so that the reflecting film 10 can be prevented from being peeled off from the inner side surface of the recessed portion 1 thanks to the sticking effect of projected ends 9A of the fillers 9. Projected surfaces 9B of the fillers 9 are formed into uneven surfaces by partial projection of the fibers, so that they are well attached to the reflecting film 10, and thus the reflecting film 10 is effectively prevented from being peeled off from the inner side surface. However, these projected surfaces may be formed flat. A large number of symbols X shown in FIG. 2B represent broken pieces generated when the projected ends 9A of the fillers 9 are broken by the drilling of the through-hole 14 by the drill 13. These broken pieces X may be attached on the surface of the resin. In this embodiment, the lengthwise direction of the fillers 9 is oriented in the horizontal direction, but instead the fillers 9 may be curved upwards as they advance towards the projected ends, or may be curved downwards as they advance towards the projected ends. The fillers 9 may be extended in any direction as long as they are stuck in the reflecting film 10. As the fillers 9, those extending straight, curving or bending may be used. In the Figures, all the fillers 9 are illustrated as extending in the same direction, but instead some may extend in different directions.

The fillers may be formed into various shapes as long as they can produce the above effect, and it is possible to use as the fillers aramid fibers, glass fibers, carbon fibers, non-woven fabric or any other fibrous fillers, or whisker fillers. Also, they are not necessarily weaved into net. These materials may be used in combination with each other.

The drill 13 has, as illustrated in FIG. 9, a blade portion 13A having a substantially conical shape that has a diameter decreasing towards a leading end (a lower end in the Figure), and a blade 13T projected from the surface of the blade portion 13A in a spiral manner. In FIG. 9, the surface of the blade 13T is illustrated as being worn flat as a result of the use of the drill 13, and can form a small uneven surface on the inner side surface 6.

Accordingly, the through-hole 14 is formed by the drill 13 by a countersinking process in the glass epoxy resin substrate of a laminate of a large number of layers, which are laminated in the vertical direction. Whereby, as illustrated in FIG. 2B, the inner side surface of the recessed portion 1 entirely or partially forms thereon an uneven surface 15 with spiral ridges and grooves, and the fillers 9 are projected outwards through the uneven surface 15. Herein, the through-hole 14 is formed by using the drill 13, thereby forming the uneven surface 15, so that the area of the inner side surface contacting the reflecting film 10 is increased, and hence adhesiveness between the inner side surface 6 and the reflecting film 10 (and more specifically a ground layer 16 of the reflecting film 10 in this arrangement, which will be described hereinbelow), in addition to the sticking effect of the fillers 9 that are projected outwards through the uneven surface 15. In this arrangement, the uneven surface 15 may be omitted. Specifically, when the through-hole 14 is formed by laser machining, the inner side surface 6 is not formed into an uneven surface but a flat surface. The fillers may be projected outwards by removing a resin by chemical polishing or the like.

As illustrated in FIG. 2B, a projected length L of the fillers 9 projected from the recessed portion 1 (inner side surface 6) is in a range of from 1 μm to 800 μm, and preferably in a range of from 1 μm to 500 μm so as to allow the sticking effect acting on the reflecting film 10 to be securely produced. That is, when the projected pieces 9A as projected ends of the fillers 9 are excessively short, the sticking effect is difficult to be produced. On the other hand, when they are excessively long, they are projected through the reflecting film 10, which may cause an undesirable condition. Accordingly, the projected length is set in a range mentioned above. Herein, the ground layer 16 is disposed and therefore the fillers 9 projected into the ground layer 16 effectively prevent the reflecting film 10 from being peeled off. FIG. 2B is an exaggerated view for ease of understanding.

A pitch P between the tops 15a of adjacent ridges 15A of the uneven surface 15 is set in a range of from 1 μm to 200 μm, and a difference in height between the top 15a of the ridge 15A and a bottom 15b of a groove 15B is set in a range of from 1 μm to 50 μm. This arrangement makes it possible to easily form the reflecting surface of the reflecting film 10 into a flat surface while increasing the contacting surface of the ground layer 16 to the inner side surface 6, as well as suppressing light, which has been emitted from the light emitting elements 4 and entered into the reflecting surface, from being diffusely reflected and hence makes it possible to increase the regular reflectance. Thus, this arrangement is preferable. In FIGS. 1 to 8, an outer surface (reflecting surface) of the reflecting film 10 is illustrated as an uneven surface in exaggerated form, but it has a surface configuration substantially approximate to a flat. Since the uneven surface 15 is formed by use of the drill 13, the ridges and the grooves are continuously arranged alternately with each other in a spiral manner, but it; is possible to employ an arrangement in which independent annular ridges and independent annular grooves are arranged in the vertical direction.

Figure 3:
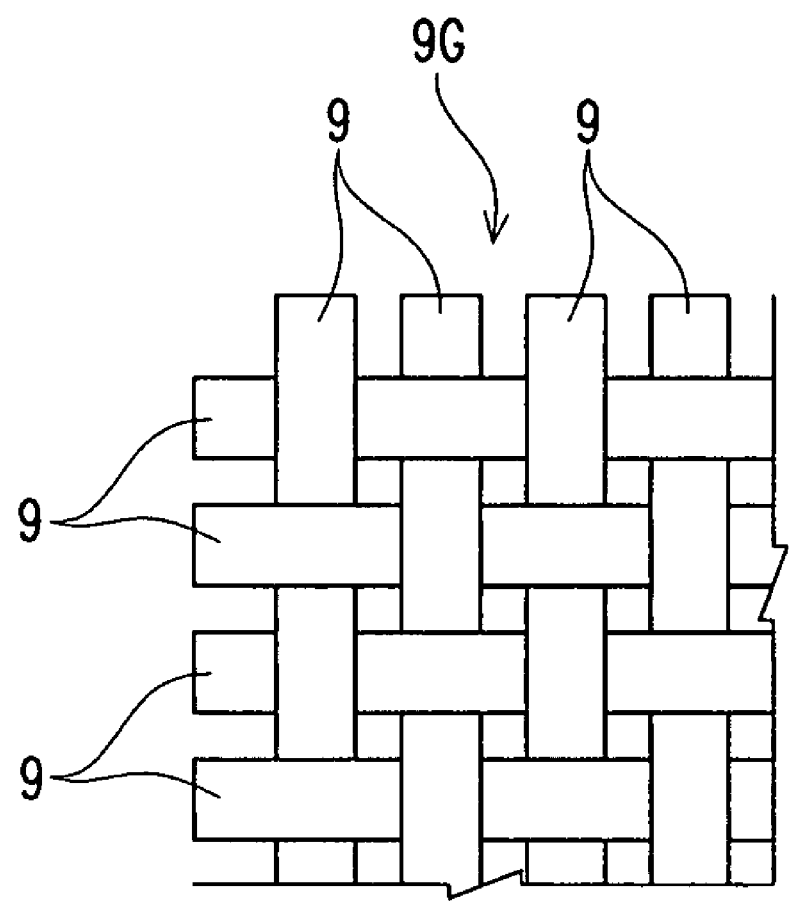
FIG. 3 is a plan view of an essential portion illustrating a glass fiber bundle.

A more detailed description will be made for the fillers 9. As illustrated in FIGS. 2A, 2C and FIG. 3, a glass fiber bundle 9G is formed by bundling a large number of the glass fibers and incorporating the same into a lattice, thereby forming a glass cloth, and then hardened with an insulating resin G. The fillers 9 are formed with a single layer of the thus formed glass cloth or a laminate of plural glass clothes. FIG. 2C illustrates an arrangement with a single layer. FIG. 2A illustrates an arrangement with a laminate formed by laminating a number of layers.

Now, the description will be made for the reflecting film 10. The inner side surface 6 of the recessed portion 1 is plated with copper that forms the ground layer 16 having high adhesiveness to the inner side surface 6 of the recessed portion 1, and then the ground layer 16 of copper is plated with silver having a high reflectance ratio, thereby forming the reflecting film 10. In this arrangement, the ground layer 16 is made of copper that has a good adhesive property or has a good affinity (wettability) to a resin or more specifically an epoxy resin, and therefore there is an advantage in that the reflecting film 10 is hardly peeled off in comparison with an arrangement in which silver is directly plated on the surface of the resin. Although there is an advantage of increasing the regular reflectance by using silver for the reflecting film 10, it is possible to use Al, Au, Rh, Pd, Pt, Cu, Ni or other metals.

The ground layer 16 may be made of any materials as long as they are different from the material of the reflecting film 10 and can increase adhesiveness between the resin and the reflecting film 10. For example, it is possible to use Cu, Ni, Au and W, and preferably use Pd, Pt, Rh, Ir, Ru and Os. These may be used in combination with each other.

FIGS. 4 to 8 illustrate various types of light emitting diode. These will be described below.

Figure 4:
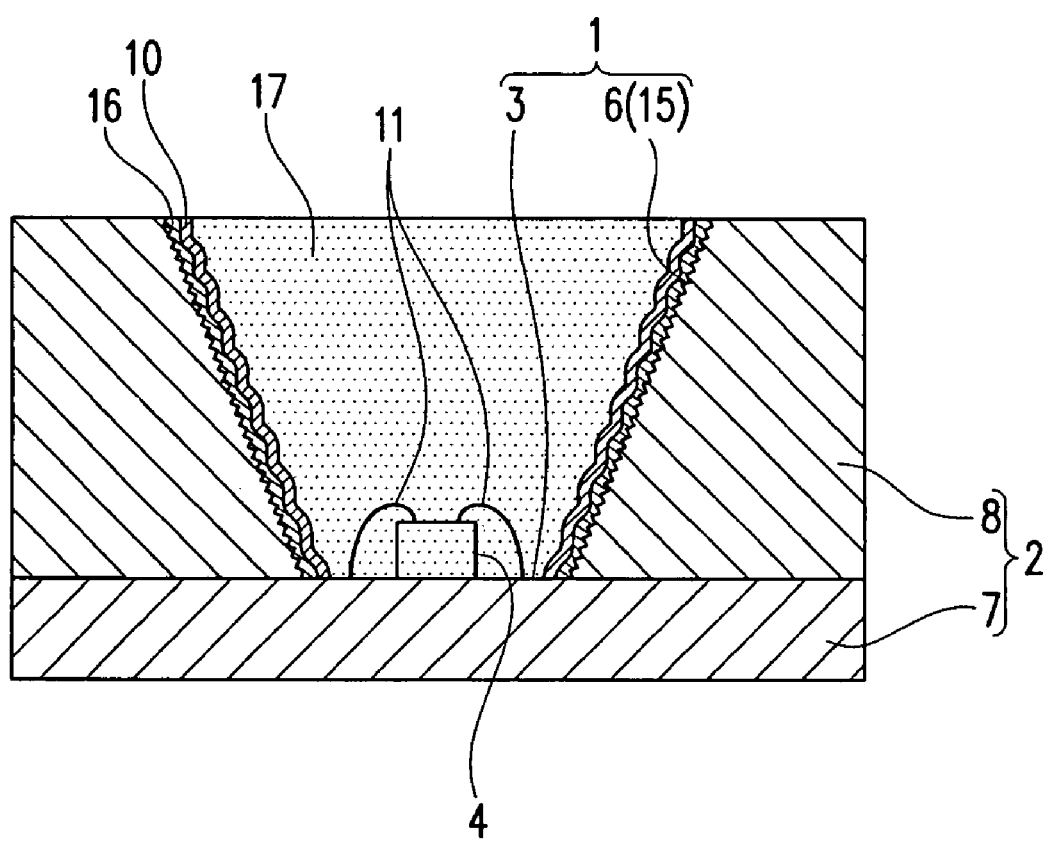
FIG. 4 is a vertically cross sectional view of a first light emitting diode.

In FIG. 4, the entire area of the recessed portion 1 is filled with the light transmitting material 17 as a sealing resin that has a light transmitting capability and is intended to seal the light emitting elements. FIGS. 4 to 8 illustrate an arrangement with the uneven surface 15 therein, although an arrangement having a flat surface without the uneven surface 15 may be employed.

Figure 5A:
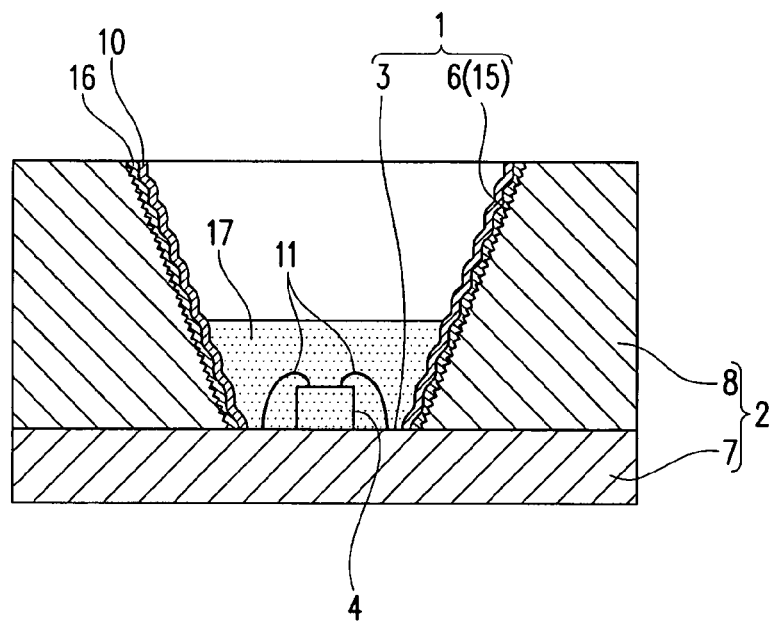
FIG. 5A is a vertically cross sectional view of a second light emitting diode.
Figure 5B:
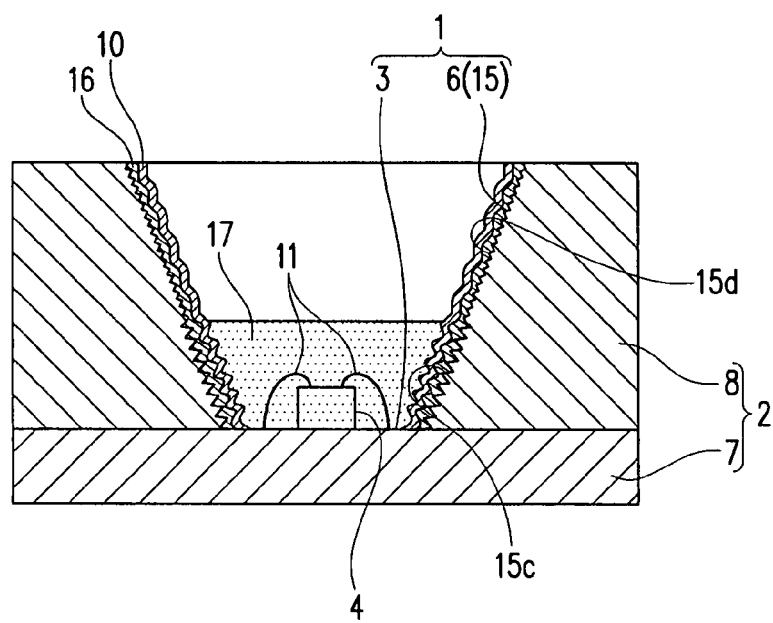
FIG. 5B is a vertically cross sectional view illustrating the second light emitting diode with the degree of unevenness of the inner side surface of the light emitting diode changed.

FIGS. 5A and 5B illustrate an arrangement with almost half of the depth (vertical length) of the recessed portion 1 filled with the light transmitting material 17, and in other words an arrangement with the light transmitting material 17 filled to such a degree as to allow a portion of the inner side surface 6 of the recessed portion 1 exposed to the outside. It is to be noted that the amount of a resin for sealing may be varied as long as the recessed portion is partially filled. This arrangement can limit the rate of decay of light to low as compared with the arrangement illustrated in FIG. 4. Specifically, light emitted from each light emitting element 4 passes through the upper side (surface) of the light transmitting material 17, reflects on an exposed upper half of the reflecting film 10, so that the light is irradiated to the front side (upper side in the Figures) of the light emitting element 4. Therefore, the traveling distance by which light passes through the light transmitting material 17 is shortened as compared with the arrangement of FIG. 4, so that the rate of decay of the light can be limited to low by such a decrease. In FIG. 5B, of the uneven surface 15 forming the inner side surface 6, an uneven surface 15c contacting the light transmitting material 17 is shaped to have a distance in height between the top and the bottom greater than an exposed uneven surface 15d that does not contact the light transmitting material 17 and is exposed to the outside. This arrangement allows not only the contacting area between the inner side surface 6 and the ground layer 16 of an area, in which less influence is caused to the light reflecting, to be further increased, but also the unevenness of a side of the reflecting film 10 facing the light emitting element 4 to be increased. Accordingly, by further increasing the contacting area between the reflecting film 10 and the light transmitting material 17 than that of FIG. 5A, it is possible to make the ground layer 16 hard to be peeled off from the inner side surface 16, as well as make the light transmitting material 17 hard to be peeled off from the reflecting film 10.

Figure 6:
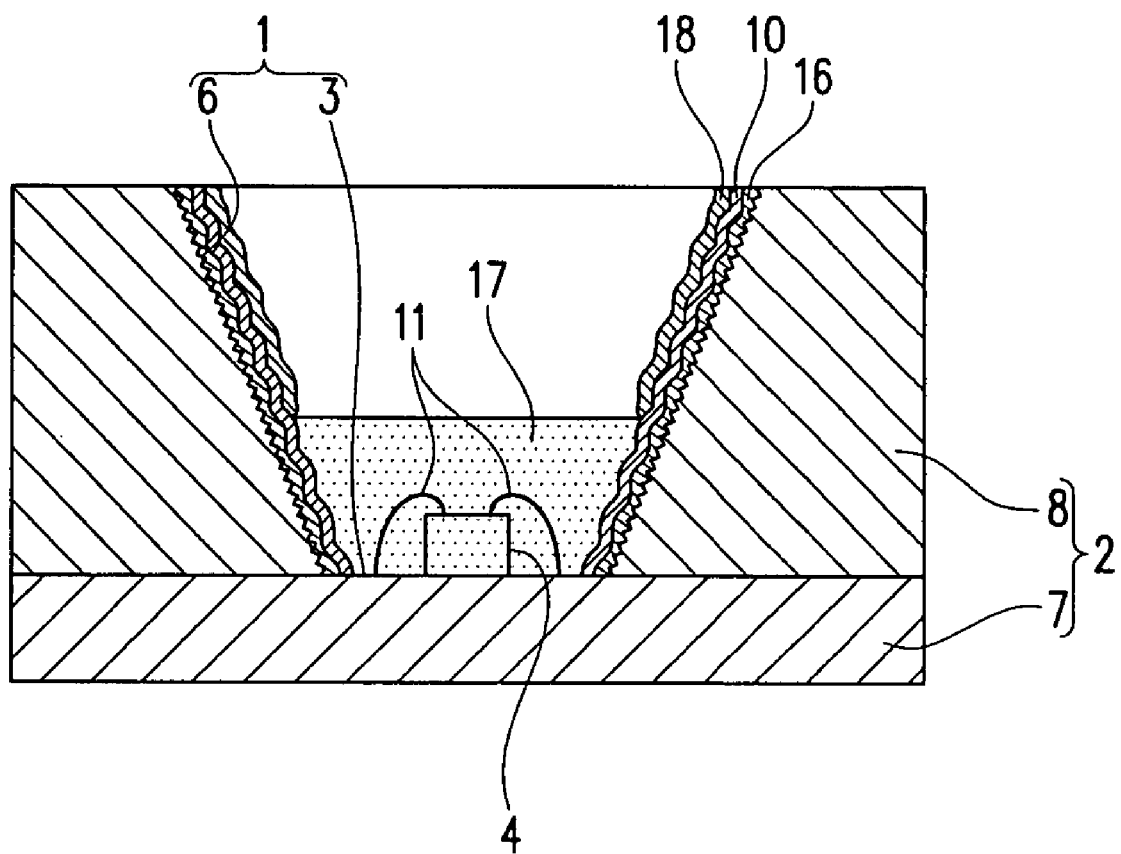
FIG. 6 is a vertically cross sectional view of the light emitting diode of FIG. 5A with an exposed surface of a reflecting film being provided with an anticorrosive layer.

FIG. 6 illustrates an arrangement, in which an anticorrosive agent is coated on a portion of the reflecting film 10, which portion being exposed in the arrangements of FIGS. 5A and 5B, thereby forming an anticorrosive layer 18 and hence preventing the exposed uneven surface 15d from being corroded. For the anticorrosive layer 18, it is possible to use a material different from the material of the reflecting film 10 and having high sulfur resistance and high corrosion resistance, and for example use Au, Pd, Pt, Rh, Ir, Ru and Os. They may be used in combination with each other.

Figure 7A:
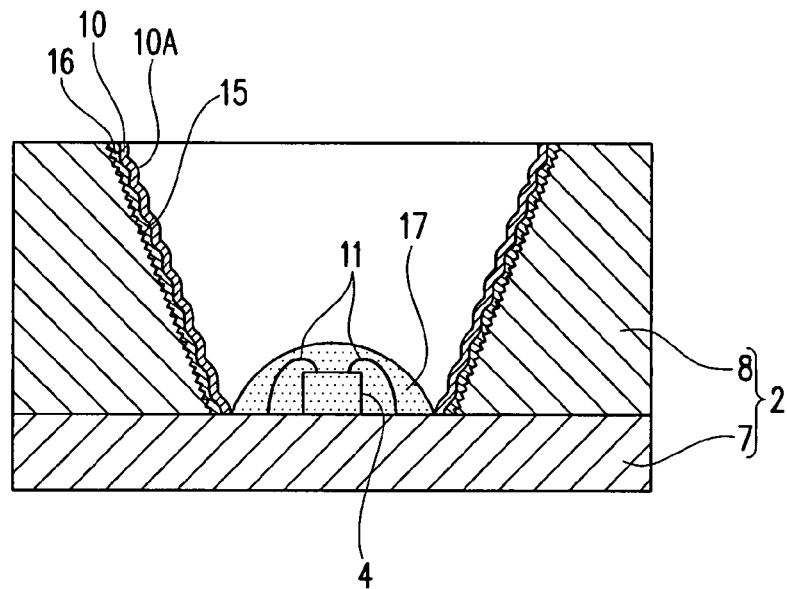
FIG. 7A is a vertically cross sectional view of a third light emitting diode.
Figure 7B:
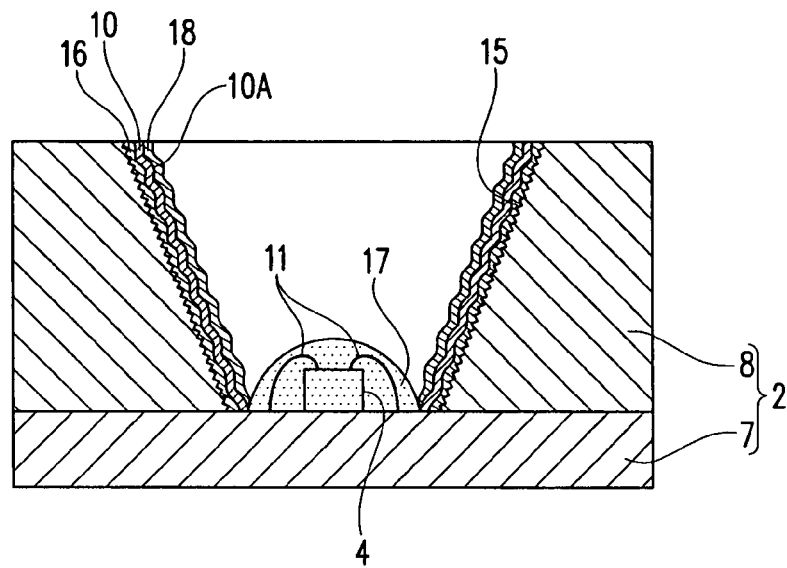
FIG. 7B is a vertically cross sectional view of the third light emitting diode with an exposed surface of a reflecting film being provided with an anticorrosive layer.

In FIGS. 7A and 7B, the light transmitting material 17 is formed into a dome-like shape (hemispherical shape) and placed on the bottom surface of the recessed portion 1. This arrangement provides an advantage in that the rate of decay of light due to the light transmitting material 17 can be further limited to low. In FIG. 7B, the anticorrosive layer 18 is disposed on the outer surface (the surface exposed to the outside) of the reflecting film 10, thereby allowing for prevention of corrosion of the outer surface 10A of the exposed reflecting film 10. In FIGS. 7A and 7B, the light transmitting material 17 partially contacts the reflecting film 10 or the anticorrosive layer 18, while it is possible to employ an arrangement in which they do not contact each other.

Figure 8:
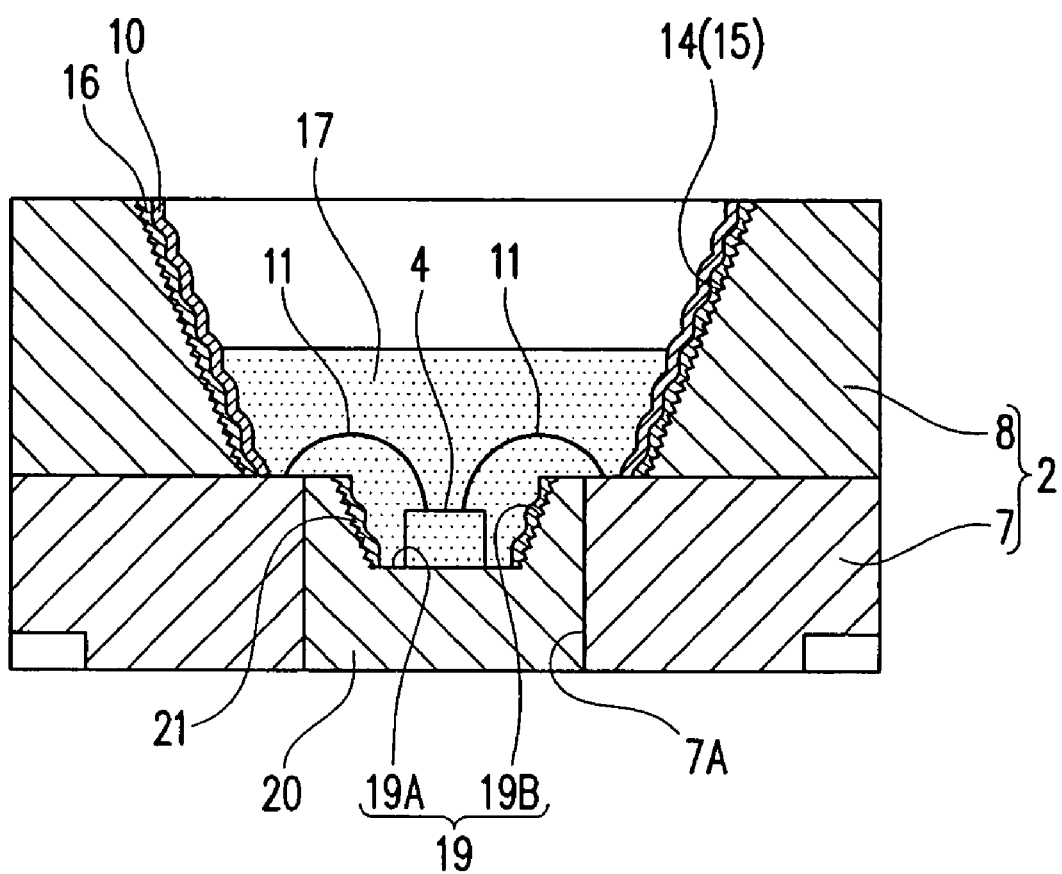
FIG. 8 is a vertically cross sectional view of a fourth light emitting diode.

In FIG. 8, a through-hole 7A is formed at a center of the flat plate member 7, and a heat sink 20 made of metal such as copper and having a second recessed portion 19 is fixedly fitted therein, and a light emitting element 4 is mounted on a bottom surface 19A of the second recessed portion 19. This second recessed portion 19 and the through-hole 14 (inner side surface 6) formed in the side wall member 8 together form the recessed portion 1. The second recessed portion 19 has an inner side surface 19B that has a tapered surface with an uneven surface configuration, which surface expanding radially outwards towards an upper end. The inner side surface 19B has a second reflecting film 21. In FIG. 8, the second recessed portion 19 is formed and therefore the plate thickness in the second recessed portion 19 of the heat sink 20 is decreased. In order to prevent damage of the portion 19 due to the deterioration of the strength, the heat sink 20 is formed by using copper. Instead of copper, other metal materials may be used, and also it is possible to employ an arrangement with the second recessed portion 19 formed at a center of the flat plate member 7. In a case where the second recessed portion 19 is formed at the center of the flat plate member 7, it is possible to employ an arrangement in which the ground layer 16 is disposed on the inner side surface 19B of the second recessed portion 19 and the second reflecting film 21 is disposed thereon, or an arrangement in which the second reflecting film 21 is not disposed on the inner side surface 19B of the second recessed portion 19. In this arrangement, the inner side surface 19B of the second recessed portion 19 is preferably formed into a flat surface.

Figure 10A:
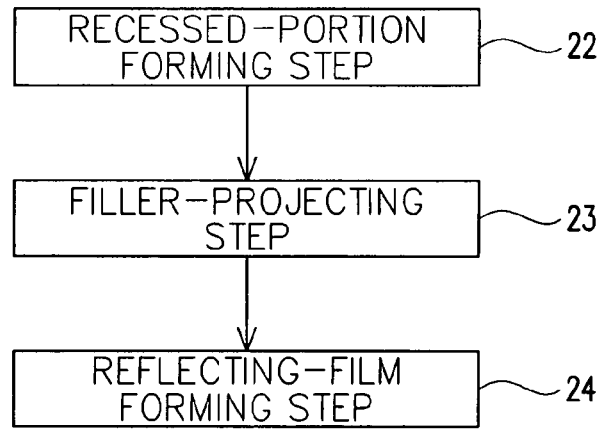
FIGS. 10A and 10B are two block diagrams each illustrating a manufacturing step of a light emitting diode.

Now, the description will be made for a method of manufacturing the light emitting device with reference to FIG. 10A. The method includes a recessed-portion forming step 22 of forming the recessed portion 1 in the package 2 with a large number of fibrous fillers (glass fibers) mixed in a resin (silicone resin or epoxy resin), a filler-projecting step 23 of projecting some or all of the fillers 9 outwards through the inner side surface 6 of the recessed portion 1 at the same time or subsequent to the formation of the recessed portion 1 in the recessed-portion forming step 22, and a reflecting-film forming step 24 of forming the reflecting film 10 by depositing metal by plating on the fillers 9 projected in the filler-projecting step 23, thereby manufacturing the light emitting device.

First, the recessed portion 1 is formed in the package 2 in the recessed-portion forming step 22. In this case, as mentioned above, the through-hole 14 is formed by a countersinking process by the drill 13 at a center of a glass epoxy resin substrate, and the side wall member 8 with the through-hole 14 formed therein is fixedly mounted on the upper surface of the flat plate member 7 formed of a glass epoxy resin substrate. Thus, the package 2 with the recessed portion 1 formed therein can be manufactured. In a case where the through-hole 14 is formed by the drill 13, some or all of the fillers 9 can be projected outwards through the inner side surface 6 of the recessed portion 1, and in this case the recessed-portion forming step 22 is also served as the filler-projecting step 23. It is possible to form the uneven surface 15 as an uneven portion on the inner side surface 6 of the recessed portion 1 at the same time of forming the through-hole 14 by the drill 13, and in this case the recessed-portion forming step 22 is also served as an uneven-portion forming step 25, which will be described hereinafter. In summary, it is possible to achieve the three steps only by the recessed-portion forming step 22, and therefore it is advantageous in the aspect of the manufacturing cost. However, these three steps may be carried out in such a case in which the through-hole 14 is formed by laser machining as mentioned above. Subsequent to the filler-projecting step 23 in which the filers 9 are projected, metal is plated on the fillers 9 in the reflecting-film forming step 24, thus forming the reflecting film 10. Thus, the manufacturing operation of the light emitting device is finished.

Figure 10B:
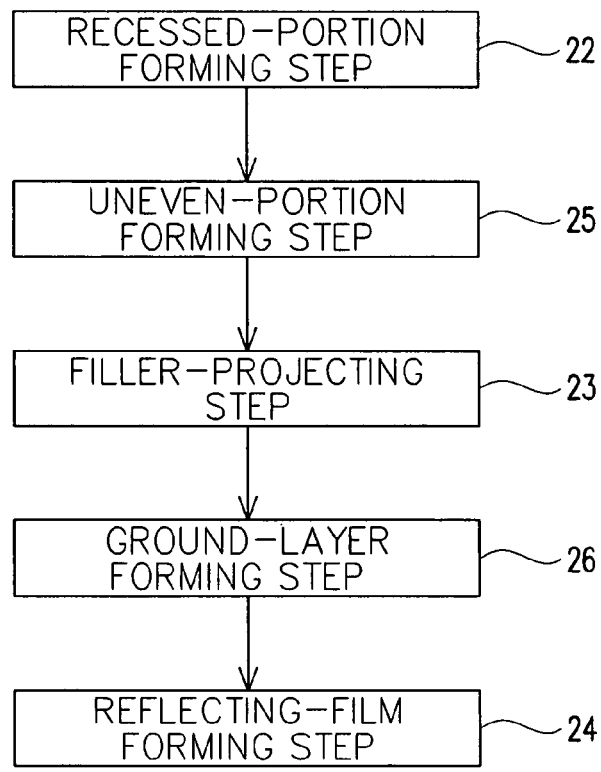

At the same time or subsequent to forming the recessed portion 1 in the recessed-portion forming step 22, the uneven-portion forming step 25 in which the uneven surface 15 as an uneven portion is formed on the inner side surface 6 of the recessed portion 1 (cf. FIG. 10B), may be provided, or the uneven surface 15 may not be formed as in a case where the through-hole 14 is formed by laser machining.

It is possible to provide a ground-layer forming step 26 (cf. FIG. 10B) in which the ground layer 16 having high adhesiveness to the inner side surface 6 of the recessed portion 1, or omit the ground layer 16 depending on the type of the resin for forming the package 2.

Now, the description will be made for the respective parts or members.

(Light Emitting Element)

It is possible to use a light emitting element in which a semiconductor of GaAlN, ZnS, ZnSe, SiC, GaP, GaAlAs, AlN, InN, AlInGaP, InGaN, GaN, AlInGaN or the like is formed as a light emitting layer. As the structure of the semiconductor, it; can be cited a homo structure, hetero structure or double-hetero structure provided with a MIS junction, PIN junction or PN junction. The emission wavelength may be varied from the ultraviolet to the infra-red depending on the material of a semiconductor layer, its mixed crystal composition ratio or the like. The light emitting layer may be of a single-quantum-well structure, multi-quantum-well structure or the like formed into a thin film that produces quantum effects. The light emitting element as used has electrodes disposed on the same side, but may have electrodes disposed respectively on the upper and lower sides. A light emitting element may be mounted face-down on a base without using wires.

A single or plural light emitting elements may be mounted. Also, it is possible to use a light emitting element that emits light from the ultraviolet to the infrared, but a light emitting element that emits visible light is preferably used. The type of the light emitting element is appropriately changed according to the absorption spectrum, emission spectrum or the like, of a fluorescent material, or the luminescent color of the light emitting device, but a light emitting element that has a luminescence peak wavelength of from 360 nm to 470 nm, since a light emitting element having a luminescence peak wavelength of 300 nm or lower may cause deterioration of a coating material that holds the fluorescent material.

The light emitting element is mounted on the bottom surface of the recessed portion of the package, and is electrically connected to electrodes disposed on the bottom surface of the recessed portion for external connection. In a case where the light emitting element is electrically connected with bonding wires, the bonding wires are preferably made of a material being excellent in ohmic property to the electrodes of the light emitting element, mechanical connectivity, electric conductivity and thermal conductivity. The thermal conductivity is preferably 50 w/(mK) or more and more preferably 200 w/(mK) or more. In consideration of the handling property or the like, the diameter of the bonding wires is preferably 1.0 μm or greater but 45 μm or smaller. Examples of the material of the bonding wires include metal such as gold, copper, platinum and aluminium, and alloy thereof. These bonding wires can be easily bonded between the light emitting element and the internal terminals. Although not illustrated, the light emitting element may be flipchip mounted.

(Light Transmitting Material)

Examples of a specific material for forming the light transmitting material include epoxy resin, silicone resin, modified silicone resin, acrylic resin, imide resin and urea resin. Of them, epoxy resin and silicone resin are preferable because of excellent heat resistance and light stability. The light transmitting material may contain a fluorescent material that is capable of converting the wavelength of light emitted from a light emitting element. For example, it is possible to adjust the distribution of the fluorescent material by, for example, adjusting the viscosity, volatility or drip condition, of the light transmitting material. For the purpose of cutting the wavelengths other than a given desirable wavelength, organic or inorganic coloring dye or coloring pigment may be contained.

(Fluorescent Material)

Various fluorescent materials may be used, provided that a material can absorb light emitted from a light-emitting element and convert the light into light having a different wavelength. A fluorescent material is preferably a nitride-based fluorescent; material or an oxynitride-based fluorescent material activated mainly by lanthanoid element such as Eu and Ce, alkaline earth metal halogen appetite fluorescent material, alkaline earth metal boric acid halide salt fluorescent material, alkaline earth metal aluminate fluorescent material, silicate of alkali earth element, sulfide of alkaline earth element, alkaline earth thiogallate, alkaline earth silicon nitride or germanate that is activated mainly by lanthanoid element such as Eu or transition metal such as Mn, or rare earth aluminate or rare earth silicate activated mainly by lanthanoid element such as Ce, or at least one kind selected from organic material and organic complex activated mainly by lanthanoid element such as Eu. Of them, a yttrium aluminum oxide compound activated with Ce is used for the description, although the present invention is not necessarily limited thereto.

This specification is by no means intended to restrict the present invention to the preferred embodiments set forth therein. Various modifications to the light emitting device, as described herein, may be made by those skilled in the art without departing from the spirit and scope of the present invention as defined in the appended claims.

What is claimed is:

1. A light emitting device comprising a package having a recessed portion defined by a bottom surface and a side surface and a light emitting element mounted on the bottom surface of the recessed portion, wherein the package has fibrous fillers, at least some termination tips of the fillers are projected outwards through the side surface and coated with a reflection film made of metal, and the projected termination tips of the fillers are stuck to the reflection film.

2. The light emitting device according to claim 1, wherein the fillers comprise a large number of fillers bundled together.

3. The light emitting device according to claim 1, wherein the light emitting element is sealed with a light transmitting material, and the light transmitting material contacts a portion of the reflection film.

4. The light emitting device according to claim 1, wherein the light emitting element is sealed with a light transmitting material, and the light transmitting material is formed into a dome-like shape.

5. The light emitting device according to claim 1, wherein a ground layer is disposed on the side surface of the recessed portion and the reflection film is disposed on the ground layer.

6. The light emitting device according to claim 1, wherein the reflection film is coated with an anticorrosive agent.

7. The light emitting device according to claim 1, wherein at least a portion of the side surface of the recessed portion is an uneven surface provided with spiral or annular ridges and grooves.

8. The light emitting device according to claim 7, wherein a pitch between tops of the adjacent ridges of the uneven surface is set in a range of from 1 μm to 200 μm, and a difference in height between tops of the ridges and bottoms of grooves, of the uneven surface is set in a range of from 1 μm to 50 μm.

9. The light emitting device according to claim 7, wherein the difference in height of a portion of the uneven surface that contacts the light transmitting material is set to be greater than the difference in height of a portion of the uneven surface that does not contact the light transmitting material and is exposed to the outside.

10. The light emitting device according to claim 1, wherein a projected length of the fillers is in a range of from 1 μm to 500 μm.

11. A light emitting device comprising:

a package having a recessed portion defined by a bottom surface and a side surface; and a light emitting element mounted on the bottom surface of the recessed portion, wherein:

the side surface of the package is coated with a reflection film;

the package includes a plurality of fibrous fillers, at least some termination tips of the plurality of fibrous fillers are projected outwards through the side surface, and the projected termination tips of the plurality of fibrous fillers are fixedly attached to the reflection film.

12. The light emitting device of claim 11, wherein the projected ends of the plurality of projected fibrous fillers are stuck to the reflection film to prevent the reflection film from peeling off from the side surface.

13. The light emitting device of claim 11, wherein the plurality of projected fibrous fillers are projected in a direction substantially parallel to the bottom surface.

14. The light emitting device of claim 11, wherein the plurality of projected fibrous fillers are projected in a direction such that the plurality of projected fibrous fillers intersect the side surface of the package.

15. A method for manufacturing a light emitting device, the method comprising:

mounting a light emitting element on a package, wherein the package includes a recessed portion defined by a bottom surface and a side surface, and wherein the light emitting element is mounted on the bottom surface of the recessed portion;

coating the side surface of the package with a reflection film;

placing a plurality of fibrous fillers within the package, such that at least some termination tips of the plurality of fibrous fillers are projected outwards through the side surface; and sticking the projected termination tips of the plurality of fibrous fillers to the reflection film coated to the side surface of the package.

16. The method of claim 15, wherein the projected ends of the plurality of projected fibrous filler are stuck to the reflection film to prevent the reflection film from peeling off from the side surface.

17. The method of claim 15, further comprising:

projecting the plurality of projected fibrous fillers in a direction substantially parallel to the bottom surface.

18. The method of claim 15, further comprising:

projecting the plurality of projected fibrous fillers in a direction such that the plurality of projected fibrous fillers intersect the side surface of the package.

19. The method of claim 15, further comprising:

disposing a ground layer on the side surface of the recessed portion; and disposing the reflection film on the ground layer.

20. The method of claim 1, wherein at least a portion of the side surface of the recessed portion is an uneven surface provided with spiral or annular ridges and grooves.

* * * * *